United States Patent
Xu et al.

(10) Patent No.: US 11,869,603 B2
(45) Date of Patent: Jan. 9, 2024

(54) VOLTAGE REGULATION

(71) Applicant: MICRON TECHNOLOGY, INC., Boise, ID (US)

(72) Inventors: Shuai Xu, Santa Clara, CA (US); Michele Piccardi, Cupertino, CA (US); June Lee, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 17/401,524

(22) Filed: Aug. 13, 2021

(65) Prior Publication Data

US 2023/0046421 A1    Feb. 16, 2023

(51) Int. Cl.
*G11C 16/30* (2006.01)
*G05F 1/575* (2006.01)
*G11C 16/04* (2006.01)

(52) U.S. Cl.
CPC .............. *G11C 16/30* (2013.01); *G05F 1/575* (2013.01); *G11C 16/0483* (2013.01)

(58) Field of Classification Search
CPC ...... G11C 16/30; G11C 16/0483; G05F 1/575
See application file for complete search history.

(56) References Cited

U.S. PATENT DOCUMENTS

2016/0163396 A1   6/2016  Pan et al.
2019/0227587 A1*  7/2019  Mikhael .................. G05F 3/30

* cited by examiner

*Primary Examiner* — Jay W. Radke
(74) *Attorney, Agent, or Firm* — Dicke, Billig & Czaja, PLLC

(57) ABSTRACT

Integrated circuit devices might include a voltage regulator comprising an input and an output, a selectively activated current path connected between the input and output, and a controller configured to cause the integrated circuit device to connect the output to the input through the current path when a voltage level of the input has a first voltage level, maintain the connection of the output and the input through the current path until the voltage level of the input has a second voltage level higher than the first voltage level, isolate the output from the input through the current path after the voltage level of the input has the second voltage level, and regulate a voltage level of the output while the output is isolated from the input through the current path.

27 Claims, 10 Drawing Sheets

VOLTAGE REGULATION

TECHNICAL FIELD

The present disclosure relates generally to integrated circuits and integrated circuit operation, and, in particular, in one or more embodiments, the present disclosure relates to voltage regulation systems, apparatus containing a voltage regulation system, and methods of their operation during power-up.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Electronic systems often use a number of NAND devices for larger storage capacities. Due to limitations on power supply current capabilities, it is often necessary to power up these NAND devices sequentially. As the NAND devices are powered up, they can cause large current spikes. Due to the sequential nature of powering up multiple NAND devices, controllers and other circuits sharing the power supply might already be fully operational, and large current spikes could negatively impact the performance or operation of such controllers and other circuits.

DETAILED DESCRIPTION

Figure 1:
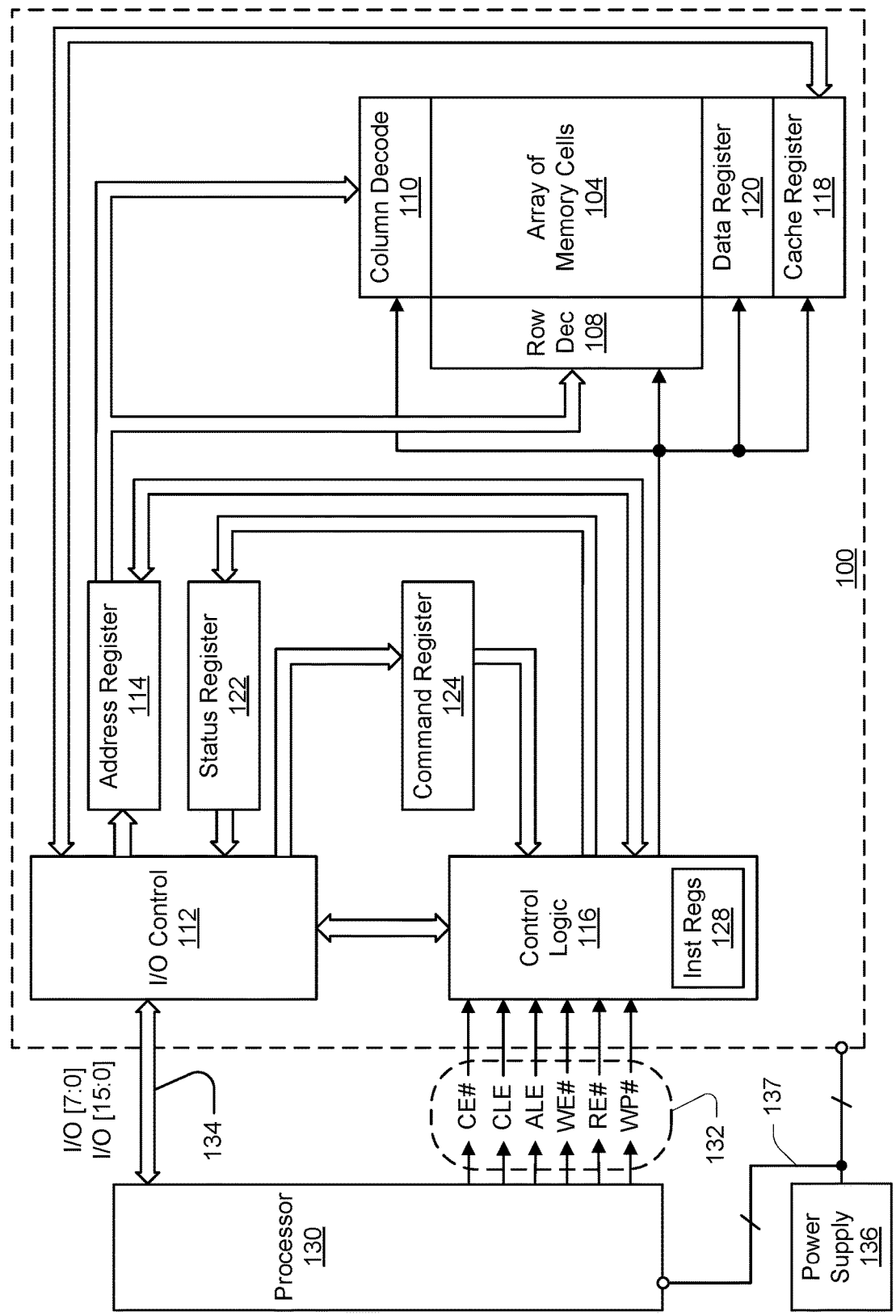
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by a conductive path unless otherwise apparent from the context.

As used herein, multiple acts being performed concurrently will mean that each of these acts is performed for a respective time period, and each of these respective time periods overlaps, in part or in whole, with each of the remaining respective time periods. In other words, portions of each of those acts are simultaneously performed for at least some period of time.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

Memory device 100 and/or processor 130 might receive power from a power supply 136. Power supply 136 might represent any combination of circuitry for providing power to memory device 100 and/or processor 130. For example, power supply 136 might include a stand-alone power supply (e.g., a battery), a line-connected power supply (e.g., a switched-mode power supply common in desktop computers and servers or an AC adapter common for portable electronic devices), or a combination of the two. Power is typically received from the power supply 136 using two or more voltage supply nodes 137, such as a supply voltage node (e.g., Vcc or Vccq) and a reference potential node (e.g., Vss or Vssq, such as ground or 0V). It is not uncommon for a power supply 136 to provide more than two voltage supply nodes 137. For simplicity, distribution of power from the voltage supply nodes 137 to components within the memory device 100 is not depicted.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2:
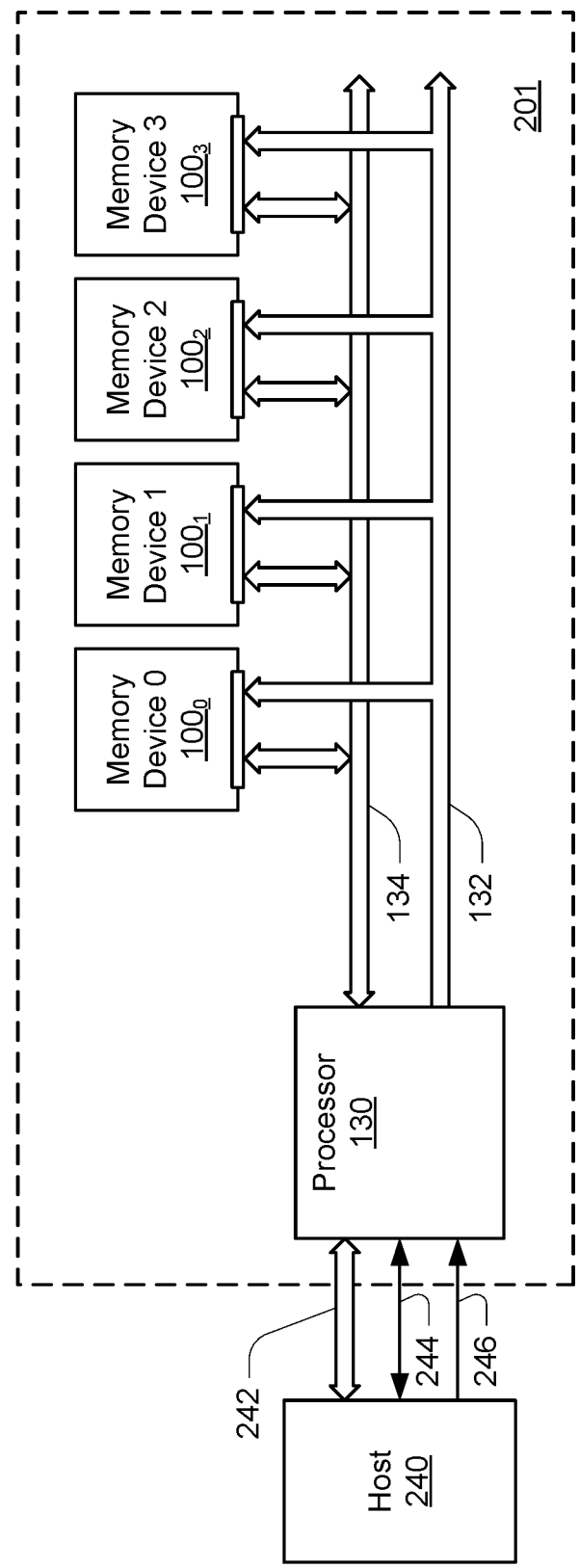
FIG. 2 is a simplified block diagram of a memory module in communication with a host as part of an electronic system, according to another embodiment.

A given processor 130 might be in communication with one or more memory devices 100, e.g., dies. FIG. 2 is a simplified block diagram of an apparatus in the form of a memory module 201 in communication with a host 240 as part of an electronic system, according to another embodiment. Memory devices 100 and processor 130 might be as described with reference to FIG. 1. Although memory module (e.g., memory package) 201 is depicted with four memory devices 100 (e.g., dies), memory module 201 could have fewer or more memory devices 100. As used herein, a die will refer to an individual integrated circuit device, which might include a memory device 100, and might include other integrated circuit devices.

Because processor 130 (e.g., a memory controller) is between the host 240 and the memory devices 100, communication between the host 240 and the processor 130 might involve different communication links than those used between the processor 130 and the memory devices 100. For example, the memory module 201 might be an Embedded MultiMediaCard (eMMC) of a solid state drive (SSD). In accordance with existing standards, communication with an eMMC might include a data link 242 for transfer of data (e.g., an 8-bit link), a command link 244 for transfer of commands and device initialization, and a clock link 246 providing a clock signal for synchronizing the transfers on the data link 242 and command link 244. The processor 130 might handle many activities autonomously, such as error correction, management of defective blocks, wear leveling and address translation.

Figure 3:
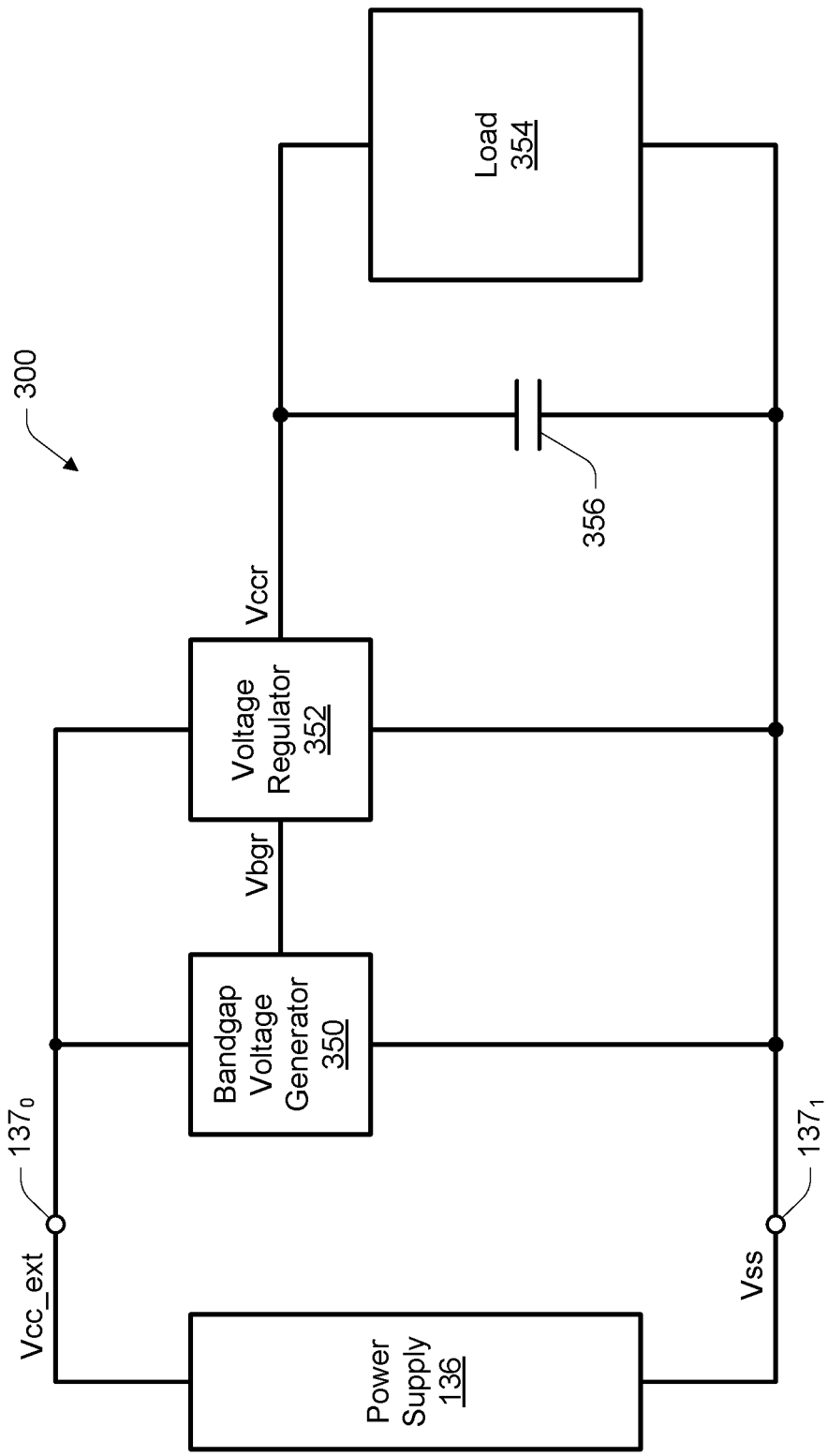
FIG. 3 is a block schematic of a voltage regulation system of the related art.

FIG. 3 is a block schematic of a voltage regulation system 300 of the related art. The voltage regulation system 300 might be a component of an integrated circuit device, e.g., a memory device. The voltage regulation system 300 might be connected to a power supply 136 through a first voltage supply node $137_0$, such as a supply voltage node (e.g., Vcc_ext) corresponding to an upper power rail, and through a second voltage supply node $137_1$, such as a reference potential node (e.g., Vss, such as ground or 0V) corresponding to a lower power rail. The voltage regulation system 300 might include a reference voltage generator, e.g., a bandgap voltage generator 350, connected between the upper and lower power rails, and might develop a reference voltage, e.g., a bandgap reference voltage Vbgr, at an output. Bandgap voltage generators are generally well understood in the art for the development of reference voltages that are generally independent of power supply variations, temperature changes and circuit loading, provided the supply voltage has a sufficient voltage level to fully develop the voltage level of the output of the bandgap voltage generator. The bandgap reference voltage Vbgr might be provided to a first input of a voltage regulator 352. A second input of the voltage regulator 352 might be connected to the first voltage supply node $137_0$. The voltage regulator 352 might also be connected to the second voltage supply node $137_1$ as the lower power rail. As will be described in more detail infra, the voltage regulator might develop an internal supply voltage Vccr at its output in response to the external supply voltage Vcc_ext and the bandgap reference voltage Vbgr. The internal supply voltage Vccr might be provided to a load 354 as a regulated upper power rail. The load 354 might also be connected to the second voltage supply node $137_1$ as the lower power rail. The load 354 might represent any combination of circuitry of an integrated circuit device that uses the internal supply voltage Vccr from the voltage regulator 352. For example, the load 354 might include the array of memory cells 104 of the memory 100 as well as the controller (e.g., control logic 116) and other components of the memory 100. The voltage regulation system 300 might further include a decoupling capacitor 356 connected between the internal supply voltage Vccr and the second voltage supply node $137_1$. Decoupling capacitors are often used between power rails to mitigate voltage spikes.

Figure 4:
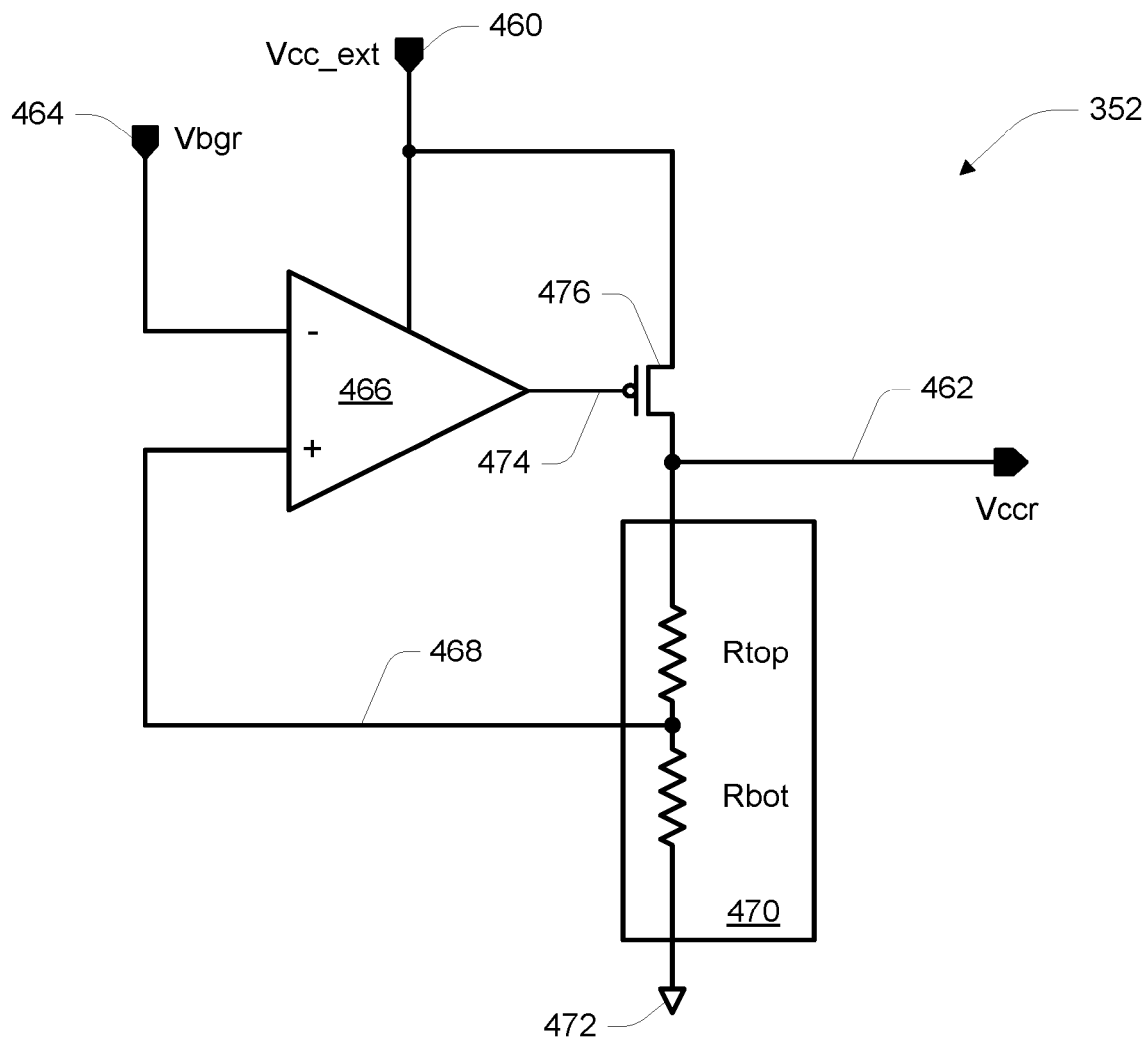
FIG. 4 is a schematic of a voltage regulator of the related art.

FIG. 4 is a schematic of a voltage regulator 352 as might be used with the voltage regulation system 300. In general, voltage regulators might include any circuit configured to regulate an output voltage level, e.g., the internal supply voltage Vccr at the output 462, that is lower than (e.g., down-regulated from) its input voltage level, e.g., the voltage Vcc_ext received at the input 460. The input 460 might be connected to the first supply voltage node $137_0$. The voltage level of the internal supply voltage Vccr might be responsive to a reference voltage, e.g., the bandgap reference voltage Vbgr, received at the input 464.

The voltage regulator 352 depicted in FIG. 4 might represent a linear voltage regulator. The voltage regulator 352 might include an operational amplifier (op-amp) 466 having a first input (e.g., an inverting input) connected to receive the bandgap reference voltage Vbgr. The op-amp 466 might have a second input (e.g., a non-inverting input) connected to receive an output 468 of a voltage divider 470, e.g., a feedback voltage. As used herein, an operational amplifier or op-amp will refer to any circuit configured to adjust (e.g., increase or decrease) its output voltage level in response to a signal differential, and to cease adjusting its output voltage level as those signals approach equality.

The voltage divider 470 might be connected between an output 462 of the voltage regulator 352 and a voltage node 472. The voltage node 472 might represent a reference potential, such as Vss, ground or 0V, and might be connected to the second supply voltage node $137_1$. Voltage divider 470 is conceptually depicted as having its output 468 between a top resistance Rtop and a bottom resistance Rbot. Voltage divider 470 might be an adjustable voltage divider to alter a resistance ratio of Rtop/(Rtop+Rbot). Voltage divider 470 might be used to adjust the gain of the voltage regulator 352, for example. The voltage level of the output 468 of the voltage divider 470 might be a feedback voltage for the op-amp 466.

The op-amp 466 might have its output 474 connected to a control gate of a transistor (e.g., a p-type field-effect transistor, or pFET) 476. The pFET 476 might have a first source/drain (e.g., source) connected to the input 460 to receive the external supply voltage Vcc_ext, and might have a second source/drain (e.g., drain) connected to the output 462. The pFET 476 might act as a resistor, and might facilitate maintaining the output 462 of the voltage regulator 352 at a target voltage level.

Figure 5:
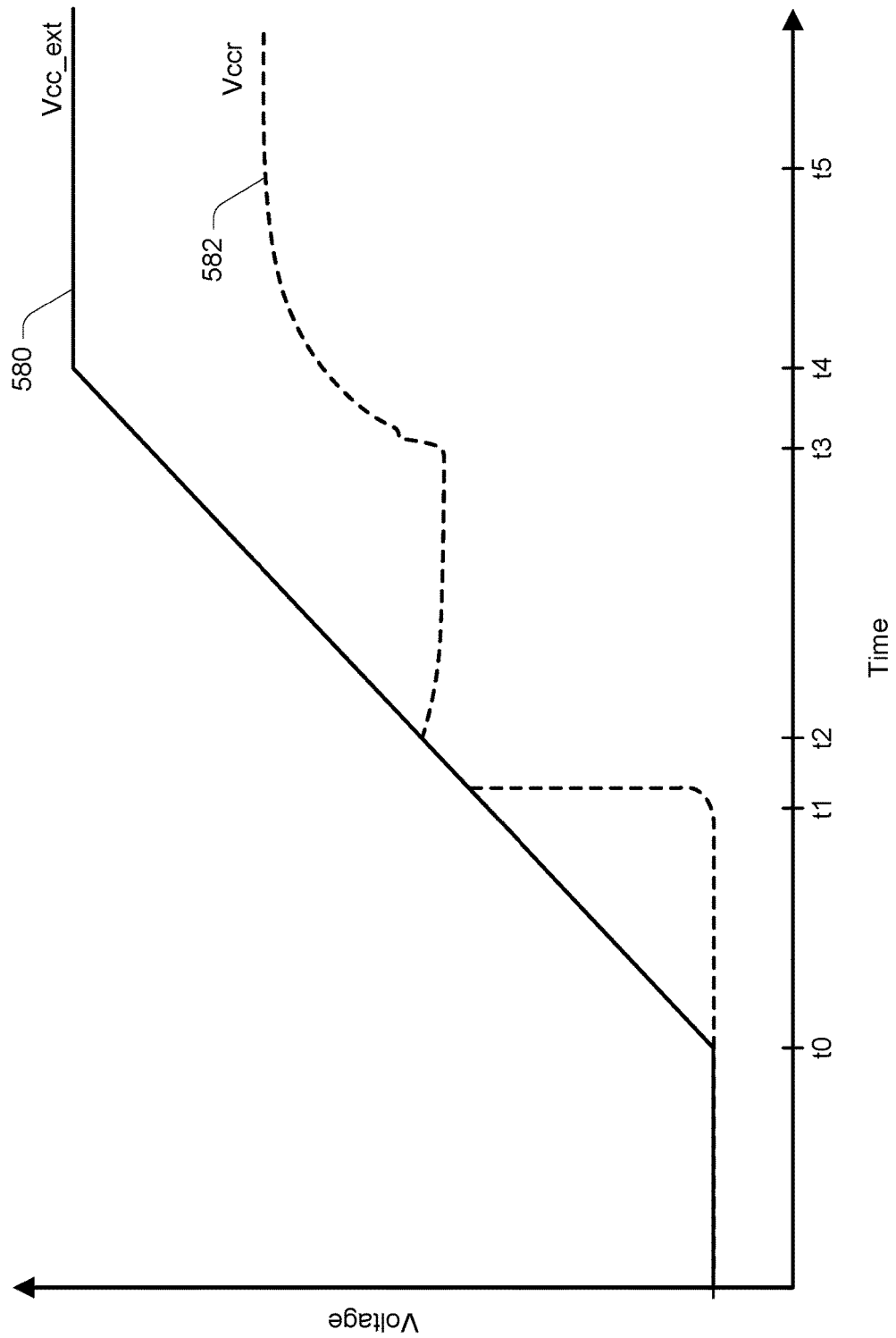
FIG. 5 is a timing diagram of voltage regulation of the related art.

FIG. 5 is a timing diagram of voltage regulation of the related art. With reference to FIG. 5, the trace 580 might represent a voltage level of the external supply voltage Vcc_ext, e.g., the voltage level received at the input 460 of the voltage regulator 352. The trace 582 might represent a voltage level of the internal supply voltage Vccr, e.g., the voltage level of the output 462 of the voltage regulator 352. Time t0 might represent an initiation of a power-up of an integrated circuit device, such as by beginning to ramp up the voltage level of the external supply voltage Vcc_ext provided to the integrated circuit device. At time t0, the external supply voltage Vcc_ext might begin to ramp up from an initial voltage level, e.g., Vss, ground or 0V. The internal supply voltage Vccr might remain at the initial voltage level as the difference between the source voltage (e.g., Vcc_ext) and the gate voltage (e.g., Vss) of the pFET 476 might remain below its threshold voltage, which might be around 1V for a typical pFET.

At time t1, the external supply voltage Vcc_ext might reach a level, e.g., around 1V, sufficient to activate the pFET 476, resulting in a rapid increase in the voltage level of the internal supply voltage Vccr. Such a rapid transition might result in a spike of current demand from the power supply. As noted, such current spikes can be detrimental to the performance or operation of other devices relying on the same power supply. The voltage level of the internal supply voltage Vccr might continue to follow the voltage level of the trace 580 until time t2, when the voltage level at the output 468 of the voltage divider 470 might reach a point where it is higher than the voltage level of the bandgap reference voltage Vbgr developed at the input 464 of the voltage regulator 352. At that point, the op-amp 466 might transition and begin applying the external supply voltage Vcc_ext to the control gate of the pFET 476, thus stalling development of the voltage level of the internal supply voltage Vccr.

At time t3, the voltage level of the bandgap reference voltage Vbgr might develop sufficiently to become higher than the voltage level at the output 468 of the voltage divider 470. As a result, the voltage level of the internal supply voltage Vccr might experience another rapid, albeit smaller, increase in voltage level, which might again result in a spike of current demand from the power supply. At this point, the voltage regulator 352 might become fully functional and begin to actively regulate the voltage level of the internal supply voltage Vccr. At time t4, the external supply voltage Vcc_ext might reach a steady-state value, and at time t5, the voltage level of the internal supply voltage Vccr might reach a steady-state value, e.g., a target voltage level of the voltage regulator 352.

Figure 6:
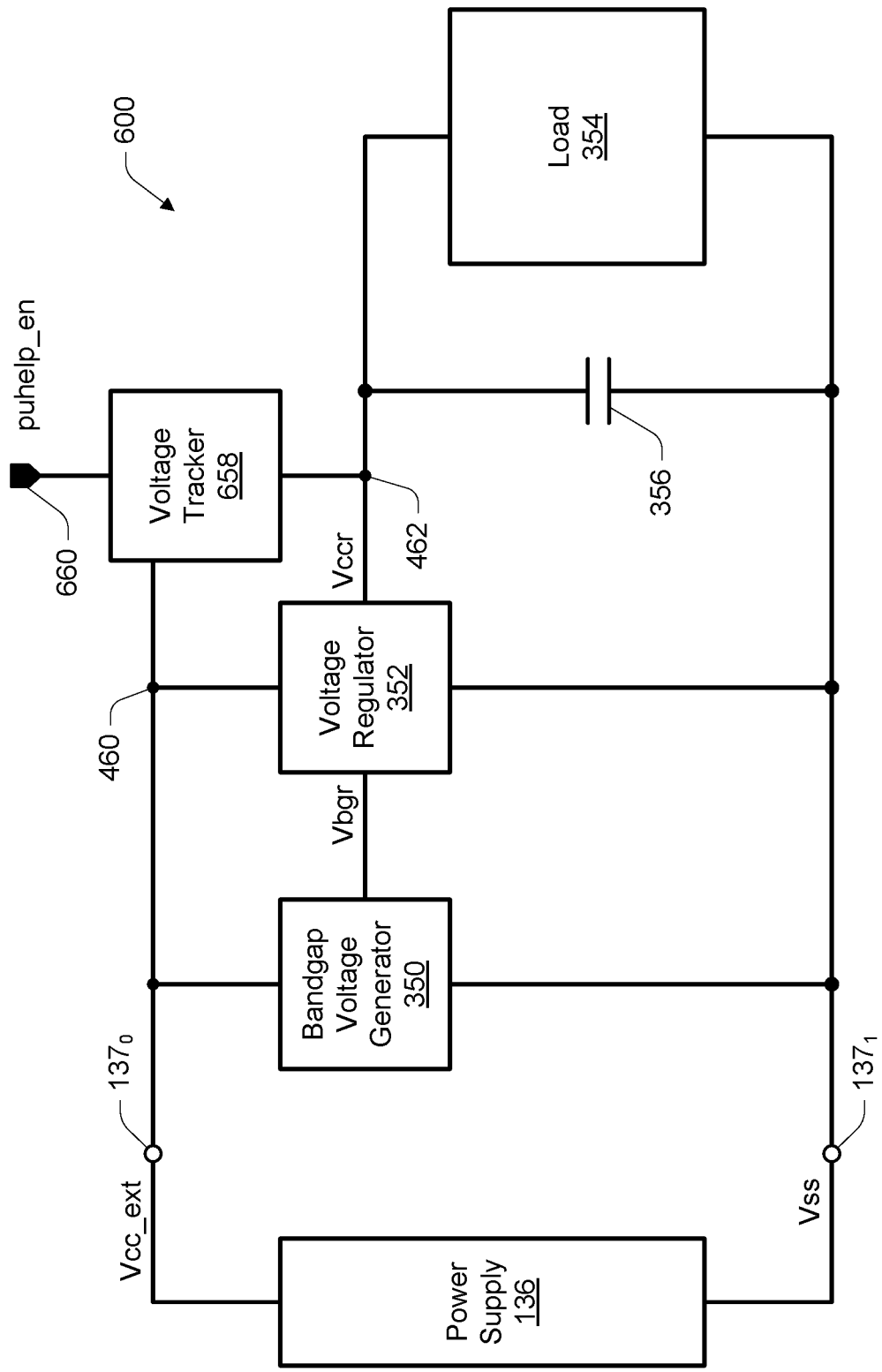
FIG. 6 is a block schematic of a voltage regulation system in accordance with an embodiment.

FIG. 6 is a block schematic of a voltage regulation system 600 in accordance with an embodiment. The voltage regulation system 600 might be a component of an integrated circuit device, e.g., a memory device. The voltage regulation system 600 might be connected to a power supply 136 through a first voltage supply node 137o, such as a supply voltage node (e.g., Vcc_ext) corresponding to an upper power rail, and through a second voltage supply node 13'71, such as a reference potential node (e.g., Vss, such as ground or 0V) corresponding to a lower power rail. The voltage regulation system 600 might include a reference voltage generator, e.g., a bandgap voltage generator 350, connected between the upper and lower power rails, and might develop a reference voltage, e.g., a bandgap reference voltage Vbgr, at an output. Bandgap voltage generators are generally well understood in the art for the development of reference voltages that are generally independent of power supply variations, temperature changes and circuit loading, provided the supply voltage has a sufficient voltage level to fully develop the voltage level of the output of the bandgap voltage generator. The bandgap reference voltage Vbgr might be provided to a first input of a voltage regulator 352. A second input of the voltage regulator 352 might be connected to the first voltage supply node $137_0$. The voltage regulator 352 might also be connected to the second voltage supply node $137_1$ as the lower power rail. As has been described supra, a voltage regulator might develop an internal supply voltage Vccr at its output in response to the external supply voltage Vcc_ext and the bandgap reference voltage Vbgr. The internal supply voltage Vccr might be provided to a load 354 as a regulated upper power rail. The load 354 might also be connected to the second voltage supply node $137_1$ as the lower power rail. The load 354 might represent any combination of circuitry of an integrated circuit device that uses the internal supply voltage Vccr from the voltage regulator 352. The voltage regulation system 600 might further include a decoupling capacitor 356 connected between the internal supply voltage Vccr and the second voltage supply node $137_1$. Decoupling capacitors are often used between power rails to mitigate voltage spikes.

In contrast with the voltage regulation system 300, the voltage regulation system 600 further includes a voltage tracker 658 having an input connected to the input 460 of the voltage regulator 352, and having an output connected to the output 462 of the voltage regulator 352. While the voltage regulation system 600 is depicted to utilize a same bandgap voltage generator 350 as the voltage regulation system 300, any circuitry configured to generate a reference voltage level would be suitable for use with embodiments. Similarly, although the voltage regulation system 600 is depicted to utilize a same voltage regulator 352 as the voltage regulation system 300, any circuitry configured to regulate an output voltage level, e.g., the internal supply voltage Vccr at the output 462, that is lower than (e.g., down-regulated from) its input voltage level, e.g., the voltage Vcc_ext received at the input 460. The voltage tracker 658 further includes a second input 660 configured to receive a control signal puhelp_en.

In general, the voltage tracker 658 might be configured to selectively short (e.g., connect) the input 460 of the voltage regulator 352 to its output 462. This could permit the voltage level of the internal supply voltage Vccr to track the voltage level of the external supply voltage Vcc_ext before the voltage regulator has a sufficient supply voltage level to actively regulate its output.

Figure 7:
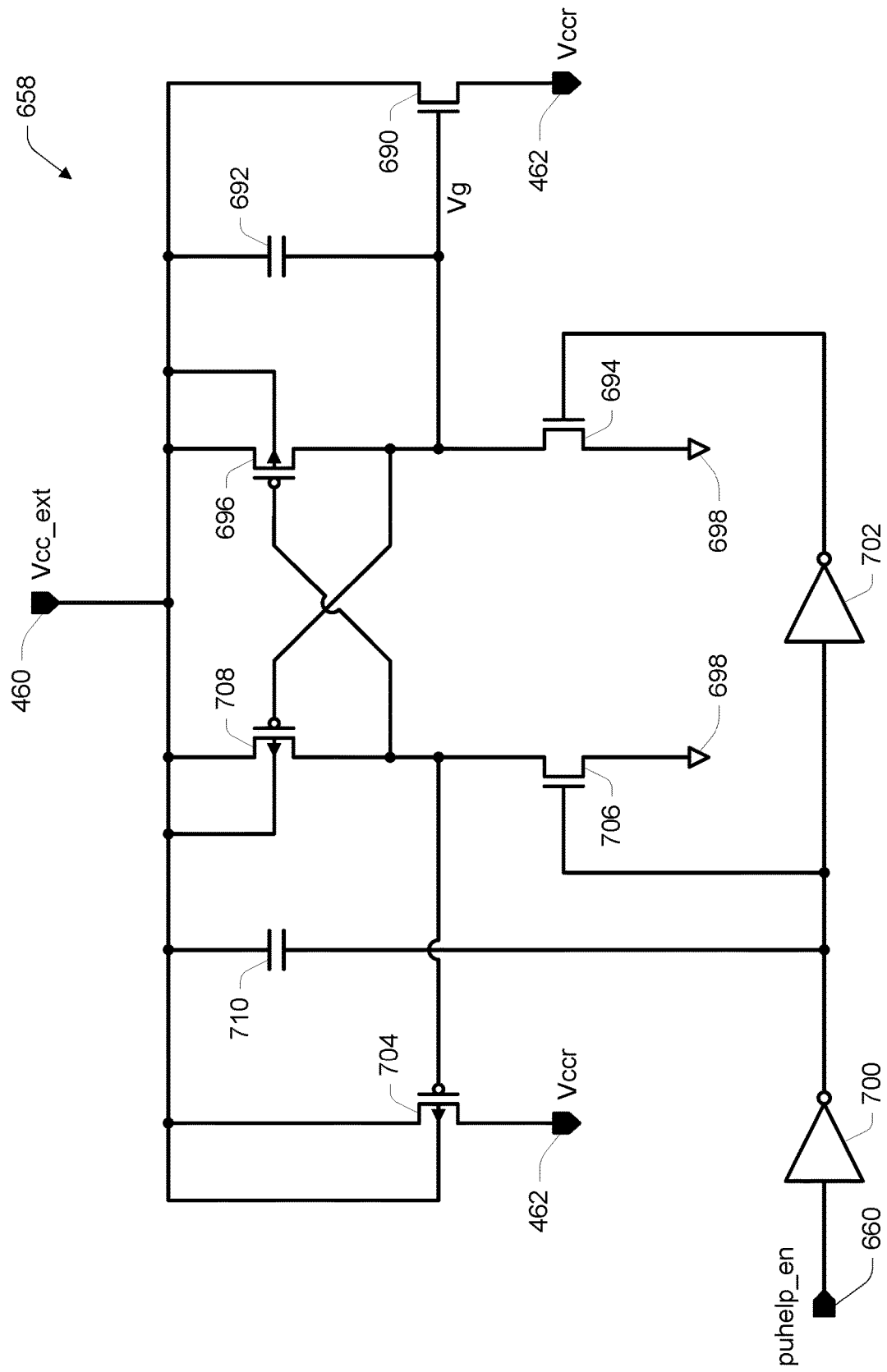
FIG. 7 is a schematic of a voltage tracker in accordance with an embodiment.

FIG. 7 is a schematic of a voltage tracker 658 in accordance with an embodiment. The voltage tracker 658 has a transistor (e.g., n-type field-effect transistor or nFET) 690 connected between the input 460 and the output 462, which might further represent the input and the output, respectively, of the voltage tracker 658. The nFET 690 might have a negative threshold voltage to facilitate close tracking of the external supply voltage Vcc_ext received at a first source/drain (e.g., drain) connected to the input 460, and the resulting internal supply voltage Vccr at a second source drain (e.g., source) connected to the output 462. While a positive threshold voltage nFET could be used, a negative threshold voltage nFET can facilitate closer tracking of the external supply voltage Vcc_ext.

A coupling capacitor 692 might have one electrode connected to the control gate of the nFET 690 and another electrode connected to the input 460. In this manner, the external supply voltage Vcc_ext might be coupled (e.g., capacitively coupled) to the control gate of the nFET 690. With a negative threshold voltage, this coupling might maintain the nFET 690 in an activated condition while the control gate is otherwise floating as the voltage level at the control gate of the nFET 690 (e.g., nearing the voltage level of the external supply voltage Vcc_ext) might remain close to, and may even exceed, the voltage level of its source (e.g., the voltage level of the internal supply voltage Vccr).

The voltage tracker 658 might further include an nFET 694 connected between the input 460, e.g., through a pFET 696, and a voltage node 698, which might be configured to receive the reference potential, e.g., Vss, ground or 0V. A first source/drain (e.g., source) of the pFET 696 might be connected to the input 460 and a second source/drain (e.g., drain) of the pFET 696 might be connected to a first source/drain (e.g., drain) of the nFET 694. A second source/drain (e.g., source) of the nFET 694 might be connected to the voltage node 698. The nFET 694 might be responsive to a control signal puhelp_en received at input 660. As depicted, the input 660 is connected to an input of a first inverter 700. An output of the first inverter 700 is connected to an input of a second inverter 702, and an output of the second inverter 702 is connected to the control gate of the nFET 694. Deactivating the nFET 694 might enable the nFET 690 for activation in response to a voltage level of the external supply voltage Vcc_ext, while activating the nFET 694 might disable the nFET 690 from activation in response to the voltage level of the external supply voltage Vcc_ext.

The voltage tracker 658 might further include a pFET 704 having a first source/drain (e.g., source) connected to the input 460 and a second source/drain (e.g., drain) connected to the output 462. While the nFET 690 might facilitate close tracking of the external supply voltage Vcc_ext at the output 462 before the external supply voltage Vcc_ext rises to a level sufficient to operate the pFET 704, the pFET 704 might facilitate improved tracking of the external supply voltage Vcc_ext after the external supply voltage Vcc_ext rises to a level sufficient to operate the pFET 704.

The voltage tracker 658 might further include an nFET 706 connected between the input 460, e.g., through a pFET 708, and the voltage node 698. A first source/drain (e.g., source) of the pFET 708 might be connected to the input 460 and a second source/drain (e.g., drain) of the pFET 708 might be connected to a first source/drain (e.g., drain) of the nFET 706. A second source/drain (e.g., source) of the nFET 706 might be connected to the voltage node 698. The nFET 706 might be responsive to the control signal puhelp_en. As depicted, the control signal puhelp_en, through the input 660, is connected to the input of the first inverter 700, and the output of the first inverter 700 is connected to the control gate of the nFET 706. Activating the nFET 706 might enable the pFET 704 for activation in response to a voltage level of the external supply voltage Vcc_ext, while deactivating the nFET 706 while the pFET 708 is activated might disable the pFET 704 from activation in response to the voltage level of the external supply voltage Vcc_ext.

The voltage tracker 658 might further include a coupling capacitor 710. The coupling capacitor 710 might have one electrode connected to the input of the second inverter 702 and another electrode connected to the input 460. In this manner, the external supply voltage Vcc_ext might be coupled (e.g., capacitively coupled) to the input of the second inverter 702 to facilitate maintaining its output at a logic low level before the external supply voltage Vcc_ext rises to a level sufficient to reliably operate the first inverter 700 that would otherwise be driving the input of the second inverter 702.

Figure 8:
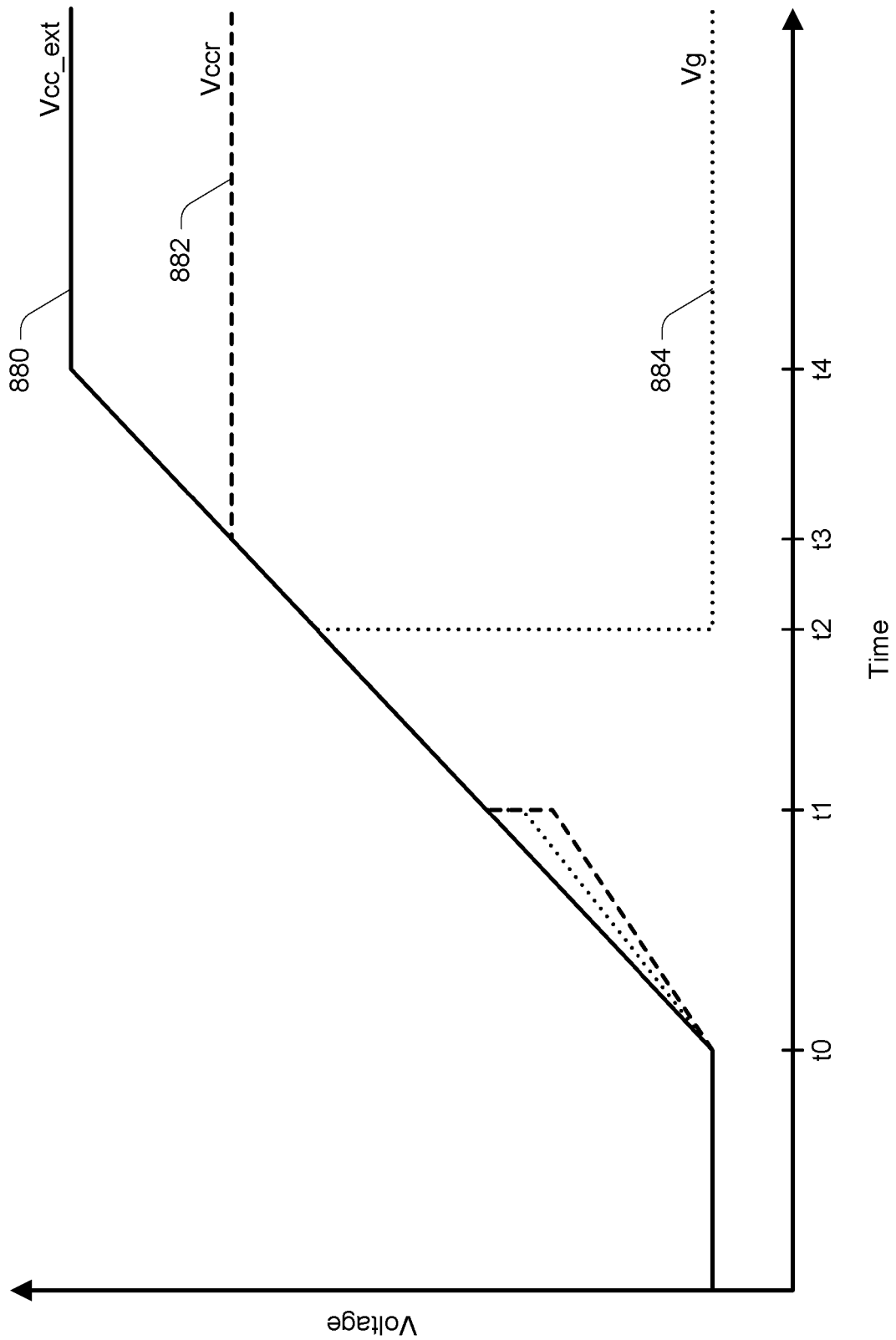
FIG. 8 is a timing diagram of voltage regulation in accordance with an embodiment.

FIG. 8 is a timing diagram of voltage regulation in accordance with an embodiment. The description of the timing diagram of FIG. 8 will be made with reference to the voltage tracker 658 of FIG. 7. With reference to FIG. 8, the trace 880 might represent a voltage level of the external supply voltage Vcc_ext, e.g., the voltage level received at the input 460 of the voltage regulator 352 and voltage tracker 658. The trace 882 might represent a voltage level of the internal supply voltage Vccr, e.g., the voltage level of the output 462 of the voltage regulator 352 and voltage tracker 658. The trace 884 might represent a voltage level of the control gate voltage Vg to the control gate of the nFET 690. Time t0 might represent an initiation of a power-up of an integrated circuit device, such as by beginning to ramp up the voltage level of the external supply voltage Vcc_ext.

At time to, the external supply voltage Vcc_ext might begin to ramp up from an initial voltage level, e.g., Vss, ground or 0V. In contrast to the voltage regulation of the related art, the internal supply voltage Vccr might also begin to ramp up from the initial voltage level. The rate of increase of the internal supply voltage Vccr might lag the rate of increase of the external supply voltage. Specifically, at time t0, the control signal puhelp_en might be at the reference potential, e.g., a logic low level. The pFET 696 and nFET 694 might be deactivated. As a result, the voltage level of the control gate voltage Vg might follow the external supply voltage Vcc_ext due to the coupling capacitor 692. This might result in activation of the negative threshold voltage nFET 690, allowing the voltage level of the internal supply voltage Vccr to closely follow the voltage level of the external supply voltage Vcc_ext. Higher capacitance values of the capacitor 692 might be used to narrow the gap between the external supply voltage Vcc_ext and the internal supply voltage Vccr. Note that the pFET 696, as well as the pFETs 704 and 708, might be deactivated at t0 as the voltage level of the external supply voltage Vcc_ext might be below the threshold voltages of the pFETs 696, 704 and 708. The coupling of the external supply voltage Vcc_ext to the input of the inverter 702 might be used to deactivate the nFET 694 by driving the output of the inverter 702 to the reference potential. As the voltage level of the external supply voltage Vcc_ext increases, the nFET 706 might activate to maintain the voltage level of the control gates of the pFETs 696 and 704 at the reference potential.

At time t1, the external supply voltage Vcc_ext might reach a level, e.g., around 1 V, sufficient to activate the pFET 704, resulting in a rapid increase in the voltage level of the internal supply voltage Vccr. Such a rapid transition might result in a spike of current demand from the power supply. However, because the internal supply voltage Vccr has been following the voltage level of the external supply voltage Vcc_ext, the magnitude of the increase is expected to be less than the related art, such that the spike in current demand might also be less. With the pFET 704 having its second source/drain connected to the output 462, it might assist the nFET 690 in tracking the voltage level of the external supply voltage Vcc_ext. As such, the voltage level of the internal supply voltage Vccr might be expected to follow the voltage level of the external supply voltage Vcc_ext more closely. The pFET 696 might also activate at time t1, thus allowing the control gate voltage Vg to also more closely track the external supply voltage Vcc_ext, which might maintain the nFET 690 in saturation.

At time t2, the control signal puhelp_en might be transitioned to a logic high level (e.g., the internal supply voltage Vccr) thus deactivating the nFET 706 with a logic low level (e.g., the reference potential) at the output of the inverter 700, and activating the nFET 694 with a logic high level at the output of the inverter 702. This might result in activation of the pFET 708, which might lead to the deactivation of the pFETs 696 and 704. The control gate voltage Vg might further return to the reference potential to deactivate the negative threshold voltage nFET 690. Time t2 might correspond to a voltage level of the external supply voltage Vcc_ext that is lower than a target voltage level of the voltage regulator. Time t2 might further correspond to a voltage level of the external supply voltage Vcc_ext that is sufficiently high to develop the reference voltage of the voltage regulator to a voltage level higher than the feedback voltage level of the voltage regulator. At this point, the voltage regulator could take over the regulation of the voltage level of the internal supply voltage Vccr without a second spike in current demand as seen in the related art. Such operation might further facilitate reaching a steady state voltage level of the internal supply voltage Vccr faster than the related art, and conceivably before the external supply voltage Vcc_ext reaches its steady state voltage level.

Figure 9:
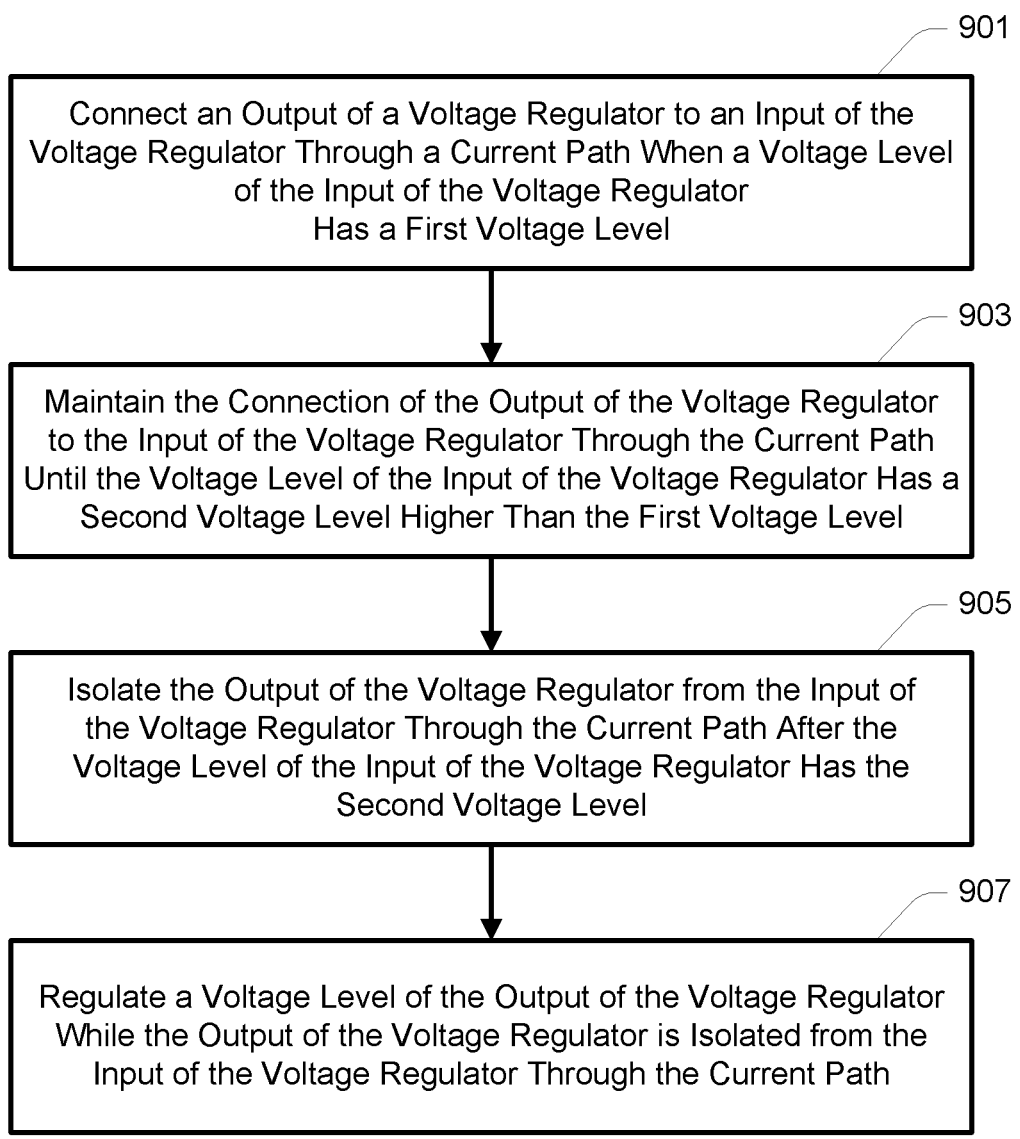
FIG. 9 is a flowchart of a method of operating an integrated circuit device in accordance with an embodiment.

FIG. 9 is a flowchart of a method of operating an integrated circuit device, e.g., a memory, in accordance with an embodiment. The method might represent actions associated with power-up of an integrated circuit device, e.g., a memory. The method might be in the form of computer-readable instructions, e.g., stored to the instruction registers 128. Such computer-readable instructions might be executed by a controller, e.g., the control logic 116, to cause the relevant components of the integrated circuit device to perform the method.

At 901, an output of a voltage regulator might be connected to an input of the voltage regulator through a current path when a voltage level of the input of the voltage regulator has a first voltage level. For example, the output 462 of the voltage regulator 352 might be connected to the input 460 of the voltage regulator 352 through the nFET 690 of the voltage tracker 658 when the external supply voltage Vcc_ext has the first voltage level. The first voltage level might correspond to the reference potential, or might otherwise correspond to a voltage level higher than a threshold voltage of the nFET 690.

At 903, the connection of the output of the voltage regulator to the input of the voltage regulator through the current path might be maintained until the voltage level of the input of the voltage regulator has a second voltage level higher than the first voltage level. For example, the nFET 690 might remain activated while the voltage level of the external supply voltage Vcc_ext ramps from the first voltage level to the second voltage level. The second voltage level might be lower than a target voltage level for the output 462 of the voltage regulator 352.

At 905, the output of the voltage regulator might be isolated from the input of the voltage regulator through the current path after the voltage level of the input of the voltage regulator has the second voltage level. For example, the nFET 690 of the voltage tracker 658 might be deactivated in response to the control signal puhelp_en after the voltage level of the external supply voltage Vcc_ext reaches the second voltage level. Note that the voltage regulator might have a different current path between its output and input, e.g., through the pFET 476 of the voltage regulator 352. However, the output of the voltage regulator has no connection to its input through the current path when the nFET 690 is deactivated. As such, they are isolated through the current path even if there is a connection through some other current path.

At 907, a voltage level of the output of the voltage regulator might be regulated while the output of the voltage regulator is isolated from the input of the voltage regulator through the current path. For example, the op-amp 466 might control a voltage level on the control gate of the pFET 476, e.g., a different current path, in response to a feedback voltage from the voltage divider 470 to selectively connect the output 462 of the voltage regulator 352 to its input 460. It is noted that the op-amp 466 might be controlling the voltage level on the control gate of the pFET 476 prior to the external supply voltage Vcc_ext reaching the second voltage level. However, while the output 462 is connected to the input 460 through the nFET 690, the voltage regulator 352 cannot be deemed to control the voltage level of the output 462.

Figure 10:
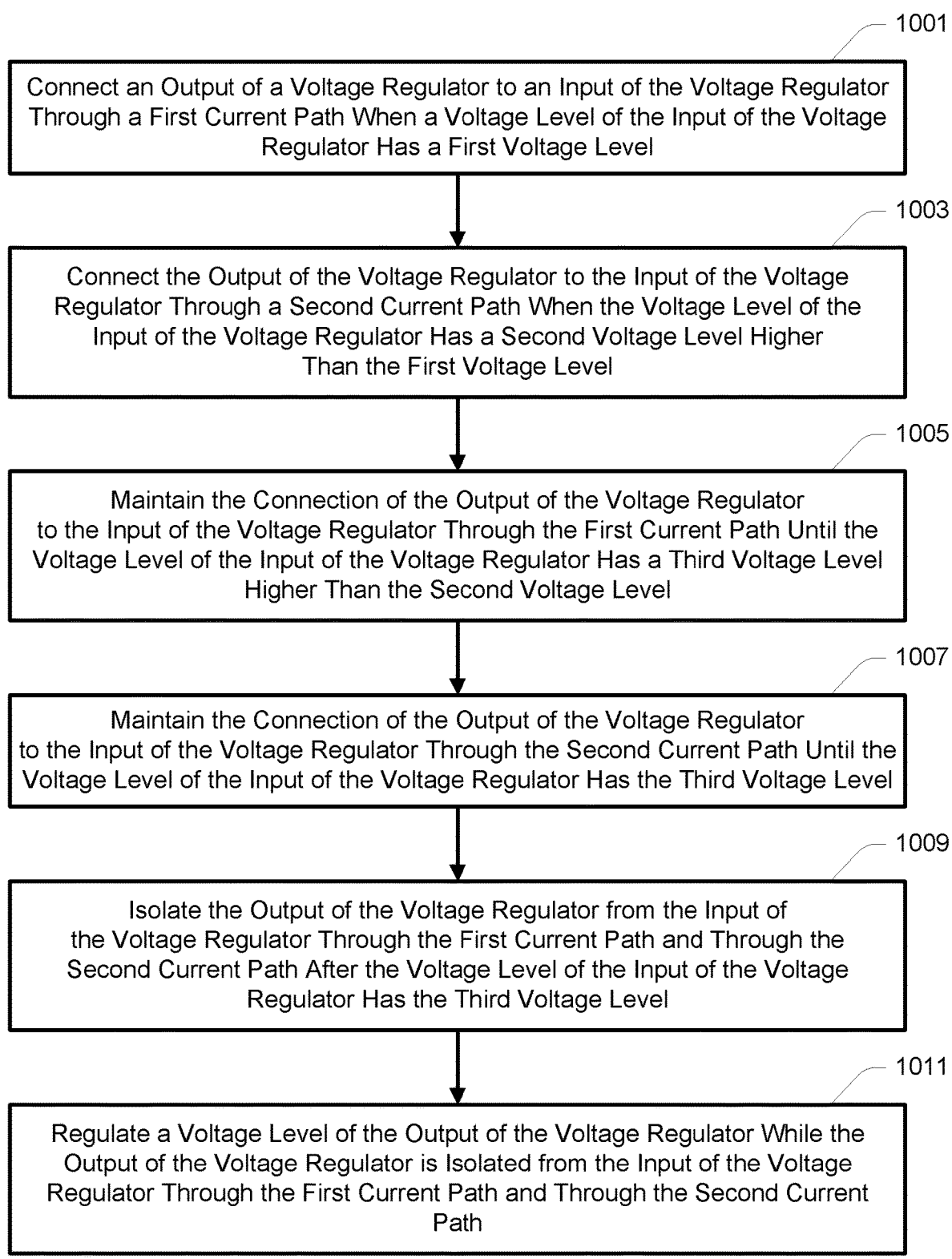
FIG. 10 is a flowchart of a method of operating an integrated circuit device in accordance with another embodiment.

FIG. 10 is a flowchart of a method of operating an integrated circuit device, e.g., a memory, in accordance with another embodiment. The method might represent actions associated with power-up of an integrated circuit device, e.g., a memory. The method might be in the form of computer-readable instructions, e.g., stored to the instruction registers 128. Such computer-readable instructions might be executed by a controller, e.g., the control logic 116, to cause the relevant components of the integrated circuit device to perform the method.

At 1001, an output of a voltage regulator might be connected to an input of the voltage regulator through a first current path when a voltage level of the input of the voltage regulator has a first voltage level. For example, the output 462 of the voltage regulator 352 might be connected to the input 460 of the voltage regulator 352 through the nFET 690 of the voltage tracker 658 when the external supply voltage Vcc_ext has the first voltage level. The first voltage level might correspond to the reference potential, or might otherwise correspond to a voltage level higher than a threshold voltage of the nFET 690.

At 1003, the output of the voltage regulator might be connected to the input of the voltage regulator through a second current path when the voltage level of the input of the voltage regulator has a second voltage level higher than the first voltage level. For example, the output 462 of the voltage regulator 352 might be connected to the input 460 of the voltage regulator 352 through the pFET 704 of the voltage tracker 658 when the external supply voltage Vcc_ext has the second voltage level. The second voltage level might correspond to a threshold voltage of the pFET 704.

At 1005, the connection of the output of the voltage regulator to the input of the voltage regulator through the first current path might be maintained until the voltage level of the input of the voltage regulator has a third voltage level higher than the second voltage level. For example, the nFET 690 might remain activated while the voltage level of the external supply voltage Vcc_ext ramps from the first voltage level to the third voltage level. The third voltage level might be lower than a target voltage level for the output 462 of the voltage regulator 352.

At 1007, the connection of the output of the voltage regulator to the input of the voltage regulator through the second current path might be maintained until the voltage level of the input of the voltage regulator has the third voltage level. For example, the pFET 704 might remain activated while the voltage level of the external supply voltage Vcc_ext ramps from the second voltage level to the third voltage level.

At 1009, the output of the voltage regulator might be isolated from the input of the voltage regulator through the first current path and through the second current path after the voltage level of the input of the voltage regulator has the third voltage level. For example, the nFET 690 and pFET 704 might be deactivated (e.g., concurrently) in response to the control signal puhelp_en after the voltage level of the external supply voltage Vcc_ext reaches the third voltage level.

At 1011, a voltage level of the output of the voltage regulator might be regulated while the output of the voltage regulator is isolated from the input of the voltage regulator through the first current path and through the second current path. For example, the op-amp 466 might control a voltage level on the control gate of the pFET 476, e.g., a third current path, in response to a feedback voltage from the voltage divider 470 to selectively connect the output 462 of the voltage regulator 352 to its input 460. It is noted that the op-amp 466 might be controlling the voltage level on the control gate of the pFET 476 prior to the external supply voltage Vcc_ext reaching the third voltage level. However, while the output 462 is connected to the input 460 through the nFET 690 and/or the pFET 704, the voltage regulator 352 cannot be deemed to control the voltage level of the output 462.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A voltage regulation system, comprising:
   a voltage regulator comprising an input, an output and a selectively activated first current path between its input and its output; and
   a voltage tracker comprising a first input connected to the input of the voltage regulator, a second input configured to receive a control signal, an output connected to the output of the voltage regulator, and a selectively activated second current path connected between the input of the voltage regulator and the output of the voltage regulator;
   wherein the voltage tracker is configured to enable the second current path for activation in response to a voltage level of the input of the voltage regulator in response to the control signal having a first logic level; and
   wherein the voltage tracker is configured to disable the second current path from activation in response to the voltage level of the input of the voltage regulator in response to the control signal having a second logic level different than the first logic level.

2. The voltage regulation system of claim 1, wherein the second current path comprises an n-type field-effect transistor (nFET) comprising a control gate capacitively coupled to the input of the voltage regulator, a first source/drain connected to the input of the voltage regulator, and a second source/drain connected to the output of the voltage regulator.

3. The voltage regulation system of claim 2, wherein the nFET has a negative threshold voltage.

4. The voltage regulation system of claim 1, wherein the voltage tracker further has a selectively activated third current path connected between the input of the voltage regulator and the output of the voltage regulator.

5. The voltage regulation system of claim 4, wherein the voltage tracker is configured to enable the third current path for activation in response to a voltage level of the input of the voltage regulator in response to the control signal having the first logic level, and wherein the voltage tracker is configured to disable the third current path from activation in response to the voltage level of the input of the voltage regulator in response to the control signal having the second logic level.

6. The voltage regulation system of claim 4, wherein the third current path comprises a p-type field-effect transistor (pFET) comprising a first source/drain connected to the input of the voltage regulator, and a second source/drain connected to the output of the voltage regulator.

7. The voltage regulation system of claim 6, wherein the second current path comprises an n-type field-effect transistor (nFET) comprising a control gate capacitively coupled to the input of the voltage regulator, a first source/drain connected to the input of the voltage regulator, and a second source/drain connected to the output of the voltage regulator.

8. The voltage regulation system of claim 7, wherein the pFET is a first pFET and the nFET is a first nFET, and wherein the voltage tracker further comprises:
   a first capacitor comprising a first electrode connected to the input of the voltage regulator, and a second electrode connected to the control gate of the first nFET;
   a second pFET comprising a control gate, a first source/drain connected to the input of the voltage regulator, and a second source/drain connected to the control gate of the first nFET;
   a second nFET comprising a control gate, a first source/drain connected to the control gate of the first nFET, and a second source/drain connected to a voltage node;
   a third pFET comprising a control gate connected to the second source/drain of the second pFET, a first source/drain connected to the input of the voltage regulator, and a second source/drain connected to the control gate of the second pFET;
   a third nFET comprising a control gate, a first source/drain connected to the second source/drain of the third pFET, and a second source/drain connected to the voltage node;
   a first inverter comprising an input connected to the second input of the voltage tracker, and an output connected to the control gate of the third nFET;
   a second inverter comprising an input connected to the output of the first inverter, and an output connected to the control gate of the second nFET; and
   a second capacitor comprising a first electrode connected to the input of the voltage regulator, and a second electrode connected to the output of the first inverter.

9. A memory, comprising:
   a voltage regulator comprising an input and an output;
   a selectively activated first current path connected between the input of the voltage regulator and the output of the voltage regulator;
   a selectively activated second current path connected between the input of the voltage regulator and the output of the voltage regulator;
   an array of memory cells connected to the output of the voltage regulator; and
   a controller connected to the output of the voltage regulator, wherein the controller is configured to cause the memory to:
      connect the output of the voltage regulator to the input of the voltage regulator through the first current path in response to a voltage level of the input of the voltage regulator having a first voltage level;
      connect the output of the voltage regulator to the input of the voltage regulator through the second current path in response to the voltage level of the input of the voltage regulator having a second voltage level higher than the first voltage level;
      maintain the connection of the output of the voltage regulator to the input of the voltage regulator through the first current path until the voltage level of the input of the voltage regulator has a third voltage level higher than the second voltage level;

maintain the connection of the output of the voltage regulator to the input of the voltage regulator through the second current path until the voltage level of the input of the voltage regulator has the third voltage level;

isolate the output of the voltage regulator from the input of the voltage regulator through the first current path and through the second current path after the voltage level of the input of the voltage regulator has the third voltage level; and regulate a voltage level of the output of the voltage regulator while the output of the voltage regulator is isolated from the input of the voltage regulator through the first current path and through the second current path.

10. The memory of claim 9, wherein the first current path comprises an n-type field-effect transistor (nFET) comprising a control gate capacitively coupled to the input of the voltage regulator, a first source/drain connected to the input of the voltage regulator, and a second source/drain connected to the output of the voltage regulator.

11. The memory of claim 10, wherein the nFET has a negative threshold voltage.

12. The memory of claim 10, wherein the second current path comprises a p-type field-effect transistor (pFET) comprising a first source/drain connected to the input of the voltage regulator, and a second source/drain connected to the output of the voltage regulator.

13. The memory of claim 12, wherein the pFET is a first pFET and the nFET is a first nFET, and wherein the memory further comprises:

a first capacitor comprising a first electrode connected to the input of the voltage regulator, and a second electrode connected to the control gate of the first nFET;

a second pFET comprising a control gate, a first source/drain connected to the input of the voltage regulator, and a second source/drain connected to the control gate of the first nFET;

a second nFET comprising a control gate, a first source/drain connected to the control gate of the first nFET, and a second source/drain connected to a voltage node;

a third pFET comprising a control gate connected to the second source/drain of the second pFET, a first source/drain connected to the input of the voltage regulator, and a second source/drain connected to the control gate of the second pFET;

a third nFET comprising a control gate, a first source/drain connected to the second source/drain of the third pFET, and a second source/drain connected to the voltage node;

a first inverter comprising an input connected to the second input of the voltage tracker, and an output connected to the control gate of the third nFET;

a second inverter comprising an input connected to the output of the first inverter, and an output connected to the control gate of the second nFET; and a second capacitor comprising a first electrode connected to the input of the voltage regulator, and a second electrode connected to the output of the first inverter.

14. An integrated circuit device, comprising:
a voltage regulator comprising an input and an output;
a selectively activated current path connected between the input of the voltage regulator and the output of the voltage regulator; and
a controller, wherein the controller is configured to cause the integrated circuit device to:

connect the output of the voltage regulator to the input of the voltage regulator through the current path in response to a voltage level of the input of the voltage regulator having a first voltage level;

maintain the connection of the output of the voltage regulator to the input of the voltage regulator through the current path until the voltage level of the input of the voltage regulator has a second voltage level higher than the first voltage level;

isolate the output of the voltage regulator from the input of the voltage regulator through the current path after the voltage level of the input of the voltage regulator has the second voltage level; and regulate a voltage level of the output of the voltage regulator while the output of the voltage regulator is isolated from the input of the voltage regulator through the current path.

15. The integrated circuit device of claim 14, wherein the current path comprises an n-type field-effect transistor (nFET) comprising a control gate capacitively coupled to the input of the voltage regulator, a first source/drain connected to the input of the voltage regulator, and a second source/drain connected to the output of the voltage regulator.

16. The integrated circuit device of claim 15, wherein the nFET has a negative threshold voltage.

17. The integrated circuit device of claim 14, wherein the current path is a first current path, and wherein the integrated circuit device further comprises:
a selectively activated second current path connected between the input of the voltage regulator and the output of the voltage regulator.

18. The integrated circuit device of claim 17, wherein the controller is further configured to cause the integrated circuit device to:

connect the output of the voltage regulator to the input of the voltage regulator through the second current path in response to the voltage level of the input of the voltage regulator having a third voltage level higher than the first voltage level and lower than the second voltage level;

maintain the connection of the output of the voltage regulator to the input of the voltage regulator through the second current path until the voltage level of the input of the voltage regulator has the second voltage level;

isolate the output of the voltage regulator from the input of the voltage regulator through the second current path after the voltage level of the input of the voltage regulator has the second voltage level; and regulate a voltage level of the output of the voltage regulator while the output of the voltage regulator is isolated from the input of the voltage regulator through the first current path and through the second current path.

19. The integrated circuit device of claim 17, wherein the second current path comprises a p-type field-effect transistor (pFET) comprising a first source/drain connected to the input of the voltage regulator, and a second source/drain connected to the output of the voltage regulator.

20. The integrated circuit device of claim 19, wherein the first current path comprises an n-type field-effect transistor (nFET) comprising a control gate capacitively coupled to the input of the voltage regulator, a first source/drain connected to the input of the voltage regulator, and a second source/drain connected to the output of the voltage regulator.

21. The integrated circuit device of claim 20, wherein the pFET is a first pFET and the nFET is a first nFET, and wherein the integrated circuit device further comprises:
- a first capacitor comprising a first electrode connected to the input of the voltage regulator, and a second electrode connected to the control gate of the first nFET;
- a second pFET comprising a control gate, a first source/drain connected to the input of the voltage regulator, and a second source/drain connected to the control gate of the first nFET;
- a second nFET comprising a control gate, a first source/drain connected to the control gate of the first nFET, and a second source/drain connected to a voltage node;
- a third pFET comprising a control gate connected to the second source/drain of the second pFET, a first source/drain connected to the input of the voltage regulator, and a second source/drain connected to the control gate of the second pFET;
- a third nFET comprising a control gate, a first source/drain connected to the second source/drain of the third pFET, and a second source/drain connected to the voltage node;
- a first inverter comprising an input connected to the second input of the voltage tracker, and an output connected to the control gate of the third nFET;
- a second inverter comprising an input connected to the output of the first inverter, and an output connected to the control gate of the second nFET; and
- a second capacitor comprising a first electrode connected to the input of the voltage regulator, and a second electrode connected to the output of the first inverter.

22. The integrated circuit device of claim 14, wherein the integrated circuit device is a memory device.

23. A method of operating an integrated circuit device, comprising:
- connecting an output of a voltage regulator to an input of the voltage regulator through a current path in response to a voltage level of the input of the voltage regulator having a first voltage level;
- maintaining the connection of the output of the voltage regulator to the input of the voltage regulator through the current path until the voltage level of the input of the voltage regulator has a second voltage level higher than the first voltage level;
- isolating the output of the voltage regulator from the input of the voltage regulator through the current path after the voltage level of the input of the voltage regulator has the second voltage level; and
- regulating a voltage level of the output of the voltage regulator while the output of the voltage regulator is isolated from the input of the voltage regulator through the current path.

24. The method of claim 23, wherein connecting the output of the voltage regulator to the input of the voltage regulator through the current path comprises activating an n-type field-effect transistor (nFET) connected between the output of the voltage regulator and the input of the voltage regulator.

25. The method of claim 24, wherein activating the nFET comprises activating an nFET having a control gate capacitively coupled to the input of the voltage regulator.

26. The method of claim 25, wherein activating the nFET having the control gate capacitively coupled to the input of the voltage regulator comprises activating a negative threshold voltage nFET.

27. The method of claim 23, wherein the current path is a first current path, and wherein the method further comprises:
- connecting the output of the voltage regulator to the input of the voltage regulator through a second current path in response to the voltage level of the input of the voltage regulator having a third voltage level higher than the first voltage level and lower than the second voltage level;
- maintaining the connection of the output of the voltage regulator to the input of the voltage regulator through the second current path until the voltage level of the input of the voltage regulator has the second voltage level;
- isolating the output of the voltage regulator from the input of the voltage regulator through the second current path after the voltage level of the input of the voltage regulator has the second voltage level; and
- regulating the voltage level of the output of the voltage regulator while the output of the voltage regulator is isolated from the input of the voltage regulator through the first current path and through the second current path.

* * * * *